US009548391B2

(12) United States Patent
Qian et al.

(10) Patent No.: US 9,548,391 B2
(45) Date of Patent: Jan. 17, 2017

(54) THIN FILM TRANSISTOR

(71) Applicants: Tsinghua University, Beijing (CN); HON HAI PRECISION INDUSTRY CO., LTD., New Taipei (TW)

(72) Inventors: Qing-Kai Qian, Beijing (CN); Qun-Qing Li, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 13/960,807

(22) Filed: Aug. 7, 2013

(65) Prior Publication Data
US 2014/0306175 A1    Oct. 16, 2014

(30) Foreign Application Priority Data

Apr. 15, 2013    (CN) .......................... 2013 1 01287856

(51) Int. Cl.
| | |
|---|---|
| H01L 29/786 | (2006.01) |
| H01L 29/06 | (2006.01) |
| H01L 29/66 | (2006.01) |
| H01L 51/10 | (2006.01) |
| H01L 51/05 | (2006.01) |

(Continued)

(52) U.S. Cl.
CPC ......... H01L 29/786 (2013.01); H01L 29/0669 (2013.01); H01L 29/66977 (2013.01); H01L 51/0558 (2013.01); H01L 51/105 (2013.01); B82Y 30/00 (2013.01); B82Y 99/00 (2013.01); H01L 51/0045 (2013.01);

(Continued)

(58) Field of Classification Search
None
See application file for complete search history.

(56) References Cited

U.S. PATENT DOCUMENTS 4,885,618 A * 12/1989 Schubert et al. ............. 257/362
6,403,408 B1 * 6/2002 Green ............... H01L 29/42384
257/E21.413

(Continued)

FOREIGN PATENT DOCUMENTS

| JP | 6-104439 | 4/1994 |
| JP | 2010141161 | 6/2010 |

(Continued)

OTHER PUBLICATIONS

JP6-104439, Apr. 15, 1994, Machine Translation.*

*Primary Examiner* — Andres Munoz
(74) *Attorney, Agent, or Firm* — Zhigang Ma

(57) ABSTRACT

A thin film transistor includes a source electrode, a drain electrode, a semiconducting layer, a first conductive layer, a second conductive layer, an insulating layer and a gate electrode. The drain electrode is spaced apart from the source electrode. The first conductive layer is sandwiched between the source electrode and the semiconductor layer. The second conductive layer is sandwiched between the drain electrode and the semiconductor layer. The gate electrode is insulated from the source electrode, the drain electrode, the first conductive layer, the second conductive layer, and the semiconductor layer by the insulating layer. A first work-function of a first material of the first conductive layer and the second conductive layer is same as a second work-function of a second material of the semiconductor layer.

20 Claims, 4 Drawing Sheets

(51) Int. Cl.
  *B82Y 99/00*  (2011.01)
  *B82Y 30/00*  (2011.01)
  *H01L 51/00*  (2006.01)

(52) U.S. Cl.
  CPC ....... *H01L 51/0048* (2013.01); *Y10S 977/742* (2013.01); *Y10S 977/938* (2013.01)

(56) References Cited

U.S. PATENT DOCUMENTS

| | | | |
|---|---|---|---|
| 7,402,506 B2* | 7/2008 | Levy | B82Y 10/00 257/E21.464 |
| 8,860,137 B2* | 10/2014 | Zhou et al. | 257/347 |
| 2009/0224230 A1* | 9/2009 | Pesetski et al. | 257/24 |
| 2010/0224862 A1 | 9/2010 | Endoh et al. | |
| 2012/0319116 A1 | 12/2012 | Ono et al. | |
| 2013/0015445 A1* | 1/2013 | Liao et al. | 257/59 |

FOREIGN PATENT DOCUMENTS

| | | |
|---|---|---|
| JP | 2012138549 | 7/2012 |
| JP | 2013-30730 | 2/2013 |
| JP | 2013-58599 | 3/2013 |

* cited by examiner

THIN FILM TRANSISTOR

This application claims all benefits accruing under 35 U.S.C. §119 from China Patent Application No. 201310128785.6, filed on Apr. 15, 2013 in the China Intellectual Property Office, the contents of which are hereby incorporated by reference.

BACKGROUND

1. Technical Field

The present invention relates to thin film transistors and, particularly, to a carbon nanotube based thin film transistor.

2. Description of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconductor layer from an accumulation state to a depletion state, with applied voltage to the gate electrode, to change an amount of the current passing between the drain electrode and the source electrode.

Bipolar TFT has the characteristic of high switching ratio and symmetry, and can be applied in the process of frequency multiplication and frequency mixing. However, because work-function of the material of the source electrode and the drain electrode is not the same as that of the semiconductor layer, a Schottky barrier is created between the semiconductor layer and the source electrode or the drain electrode. Thus, holes or electrons are selectively generated; thereby the symmetry of bipolar TFT is destroyed.

What is needed, therefore, is a TFT that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
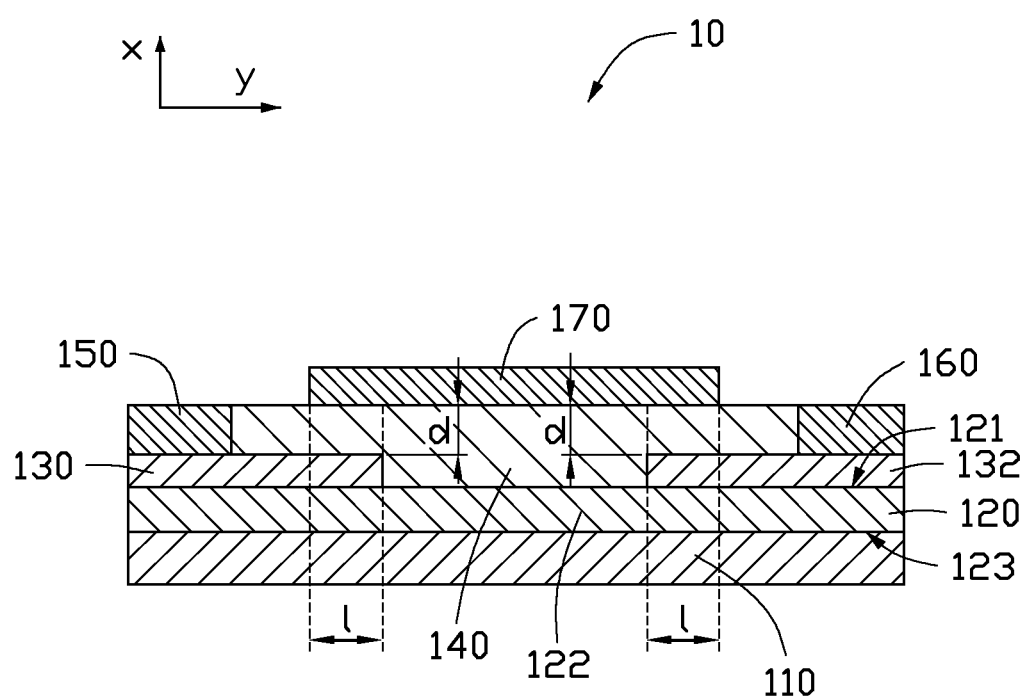
FIG. 1 is a cross sectional view of one embodiment of a thin film transistor.

Referring to FIG. 1, a thin film transistor 10 of one embodiment includes a semiconductor layer 120, a first conductive layer 130, a second conductive layer 132, an insulating layer 140, a source electrode 150, a drain electrode 160, and a gate electrode 170. The thin film transistor 10 is located on a surface of an insulating substrate 110. The first conductive layer 130 is sandwiched by the semiconductor layer 120 and the source electrode 150, and the second conductive layer 132 is sandwiched by the semiconductor layer 120 and the drain electrode 160. The source electrode 150 and the drain electrode 160 are spaced from each other. The source electrode 150 is electrically connected to the semiconductor layer 120 through the first conductive layer 130. The drain electrode 160 is electrically connected to the second conductive layer 132. The gate electrode 170 is insulated from the semiconductor layer 120, the first conductive layer 130, the second conductive layer 132, the source electrode 150, and the drain electrode 160 through the insulating layer 140.

The insulating substrate 110 is provided for supporting the thin film transistors 10. The material of the insulating substrate 110 can be the same as a substrate of a printed circuit board (PCB), and can be rigid materials (e.g., p-type or n-type silicon, silicon with an silicon dioxide layer formed thereon, crystal, crystal with a oxide layer formed thereon), or flexible materials (e.g., plastic or resin). In one embodiment, the material of the insulating substrate is glass. The shape and size of the insulating substrate 110 is arbitrary. The plurality of thin film transistors 10 can be located on the insulating substrate 110 in a predetermined order.

The thin film transistor 10 can be a top gate structure. The semiconductor layer 120 is located on the insulating substrate 110. The semiconductor layer 120 has a first surface 121 away from the insulating substrate 110 and a second surface 123 opposite to the first surface 121. The first conductive layer 130 and the source electrode 150 are stacked on one side of the first surface 121 of the semiconductor layer 120. The second conductive layer 132 and the drain electrode 160 are stacked on the other side of the first surface 121 of the semiconductor layer 120. The insulating layer 140 is located on the first surface 121 of semiconductor layer 120 and covers part of the first conductive layer 130 and the second conductive layer 132. The gate electrode 170 is located on the insulating layer 140. The first conductive layer 130 and the second conductive layer 132 are spaced apart from each other.

A direction from the second surface 123 of the semiconductor layer 120 to the first surface 121 of the semiconductor layer 120 is defined as an X direction. That is, a thickness direction of the semiconductor layer 120 is defined as the X direction. A Y direction perpendicular to the X direction is defined from the first conductive layer 130 to the second conductive layer 132 in the first surface 121 of the semiconductor layer 120. Part of the semiconductor layer 120 overlapped by the gate electrode 170 along the X direction is defined as a channel 122.

The first conductive layer 130 and the second conductive layer 132 extend towards each other along the Y direction. Parts of the first conductive layer 130 and the second conductive layer 132 are overlapped by the gate electrode 170 along the X direction. That is, orthographic projections of the first conductive layer 130 and the second conductive layer 132 along the X direction are partly overlapped by the channel 122. In detail, a first length of part of the first conductive layer 130 overlapped by the gate electrode 170 along the X direction is the same as a second length of part of the second conductive layer 132 overlapped by the gate electrode 170 along the X direction. In one embodiment, both the first length and the second length are defined as l.

The gate electrode 170 is located on a surface of the insulating layer 140 away from the semiconductor layer 120. The gate electrode 170 is spaced from and insulated with the first conductive layer 130 and the second conductive layer 132. The distance between the gate electrode 170 and the first conductive layer 130 or the distance between the gate electrode 170 and the second conductive layer 132 along the Y direction is defined as d. The l and d satisfy the formula: l≥d. Because the l is greater than or equal to the d, the channel 122 will be modulated by the gate electrode 170 completely.

Because two sides of the channel 122 are attached by the first conductive layer 130 and the second conductive layer 132 directly, two sides of the channel 122 are prevented from being affected by the insulating layer 140 and other impurities. Then the resistance of two sides of the channel 122 can be reduced and the symmetry of bipolar TFT will be much higher.

The semiconductor layer 120 can include a carbon nanotube layer. The length of the semiconductor layer 120 ranges from about 1 micrometer to about 1 millimeter. The width of the semiconductor layer 120 ranges from about 1 micrometer to about 1 millimeter. The thickness of the semiconductor layer 120 ranges from about 0.5 nanometers to about 100 millimeters.

The carbon nanotube layer includes a plurality of carbon nanotubes. The carbon nanotubes are single-walled carbon nanotubes. The carbon nanotube layer can consist of a plurality of semi-conductive carbon nanotubes obtained via chemical separating method. The carbon nanotube layer can also be composed of a combination of semi-conductive and metallic carbon nanotubes obtained via chemical vapor deposition. The ratio of semi-conductive and metallic of carbon nanotubes is 2:1. The carbon nanotube layer has good semi-conductive property. A diameter of the carbon nanotubes is smaller than 5 nanometers. In one embodiment, the diameter of the carbon nanotubes is smaller than 2 nanometers.

The carbon nanotube layer can include at least one carbon nanotube. The carbon nanotube is a single-walled carbon nanotube with a long length. When the carbon nanotube layer includes a plurality of carbon nanotubes, the plurality of carbon nanotubes is paralleled with the insulating substrate 110. The length of carbon nanotubes is greater than 5 micrometers. A part of the plurality of carbon nanotubes includes a first end and a second end opposite to the first end. The first end is electrically connected to the source electrode 150, and the second end is electrically connected to the drain electrode 160. The plurality of carbon nanotubes has good semi-conductive property. In one embodiment, the length of carbon nanotubes is greater than 10 micrometers. The plurality of carbon nanotubes can intersect with each other to form a network, and the plurality of carbon nanotubes can also be parallel with each other. In one embodiment, the plurality of carbon nanotubes is parallel with each other and extends along a direction from the source electrode 150 to the drain electrode 160. The plurality of carbon nanotubes is spaced from each other. A distance between adjacent two carbon nanotubes ranges from about 0 micrometers to about 100 micrometers. The first end of the plurality of carbon nanotubes is electrically connected to the source electrode 150, and the second end of the plurality of carbon nanotubes is electrically connected to the drain electrode 160.

The carbon nanotube layer can include a disordered carbon nanotube film. The carbon nanotube film includes a plurality of carbon nanotubes joined by van der Waals attractive force. In the disordered carbon nanotube film, the carbon nanotubes are disordered. The term 'disordered' is defined as the carbon nanotubes are arranged along many different directions, and the aligning directions of the carbon nanotubes are random. The number of the carbon nanotubes arranged along each different direction can be almost the same (e.g. uniformly disordered). The disordered carbon nanotubes can be isotropic. The disordered carbon nanotubes entangle with each other to form the disordered carbon nanotube film, and a plurality of apertures is defined by the carbon nanotubes. A diameter of the aperture can smaller than 50 micrometers. The plurality of the apertures can enhance the transparence of the carbon nanotube film. The disordered carbon nanotube film can be isotropic. The thickness of the carbon nanotube layer is in a range from about 0.5 nanometers to about 100 micrometers. The diameter of carbon nanotubes of the carbon nanotube layer is smaller than 5 nanometers. The length of carbon nanotubes of the carbon nanotube layer ranges from about 100 nanometers to about 1 millimeter. In one embodiment, the diameter of carbon nanotubes is less than 2 nanometers and the length of carbon nanotubes ranges from about 1 micrometer to about 1 millimeter.

In one embodiment, the semiconductor layer 120 is a disordered carbon nanotube film and the thickness of the semiconductor layer 120 is about 5 nanometers.

The work-function of a material of the first conductive layer 130 and the second conductive layer 132 is the same as the work-function of a material of the semiconductor layer 120. The first conductive layer 130 and the second conductive layer 132 have metallic property. The first conductive layer 130 and the source electrode 150 form an ohmic contact. The second conductive layer 132 and the drain electrode 160 form an ohmic contact. The material of the first conductive layer 130 and the second conductive layer 132 can be metallic carbon nanotubes or graphene.

The first conductive layer 130 and the second conductive layer 132 can be graphene films, metallic carbon nanotubes, or a combination of thereof.

The graphene film can include at least one graphene layer. If the graphene film includes a plurality of graphene layers, the plurality of graphene layers can overlap each other to form a large area, or stack on top of each other to form a thick film. In one embodiment, the graphene film has a single graphene layer. A thickness of the graphene film has a range from about 0.34 nanometers to about 10 nanometers. The graphene layer is a one-atom thick planar sheet composed of a plurality of $sp^2$-bonded carbon atoms. The graphene film can be a free-standing structure. The term "free-standing structure" means that the graphene film can sustain the weight of itself when it is hoisted by a portion thereof without any significant damage to its structural integrity. So, if the graphene film is placed between two separate supports, a portion of the graphene film not in contact with the two supports, would be suspended between the two supports and yet maintain structural integrity. The graphene film has good conductive property and shows metallic.

The first conductive layer 130 and the second conductive layer 132 can be a metallic carbon nanotube film. The metallic carbon nanotube film includes a plurality of carbon nanotubes. The plurality of carbon nanotubes are joined together by van der Waals attractive force. The plurality of carbon nanotubes can intersect with each other to form a network. In one embodiment, the first conductive layer 130 and the second conductive layer 132 can be a combination of the metallic carbon nanotube film and the graphene film.

In one embodiment, the first conductive layer 130 and the second conductive layer 132 is each a graphene film including one grapheme layer, the thickness of the graphene film is about 0.5 nanometers, the length l is about 100 nanometers, and the distance d is about 50 nanometers.

The source electrode 150, the drain electrode 160, and/or the gate electrode 170 are made of conductive material. In one embodiment, the source electrode 150, the drain electrode 160, and the gate electrode 170 are conductive films. A thickness of the conductive film can be in a range from about 0.5 nanometers to about 100 micrometers. The material of the source electrode 150, the drain electrode 160, and the gate electrode 170 can be selected from the group consisting of metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal.

In one embodiment, the source electrode 150, the drain electrode 160, and the gate electrode 170 are Au films. A thickness of the Au film is about 40 nanometers.

The material of the insulating layer 140 can be a rigid material such as aluminum oxide ($Al_2O_3$), silicon nitride ($Si_3N_4$), silicon dioxide ($SiO_2$), hafnium oxide ($HfO_2$), or a flexible material such as polyethylene terephthalate (PET), benzocyclobutenes (BCB), polyester or acrylic resins. A thickness of the insulating layer 140 can be in a range from about 10 nanometers to about 100 micrometers. In one embodiment, the material of the insulating layer 140 is $HfO_2$, the thickness of the insulating layer 140 is about 40 nanometers.

Figure 2:
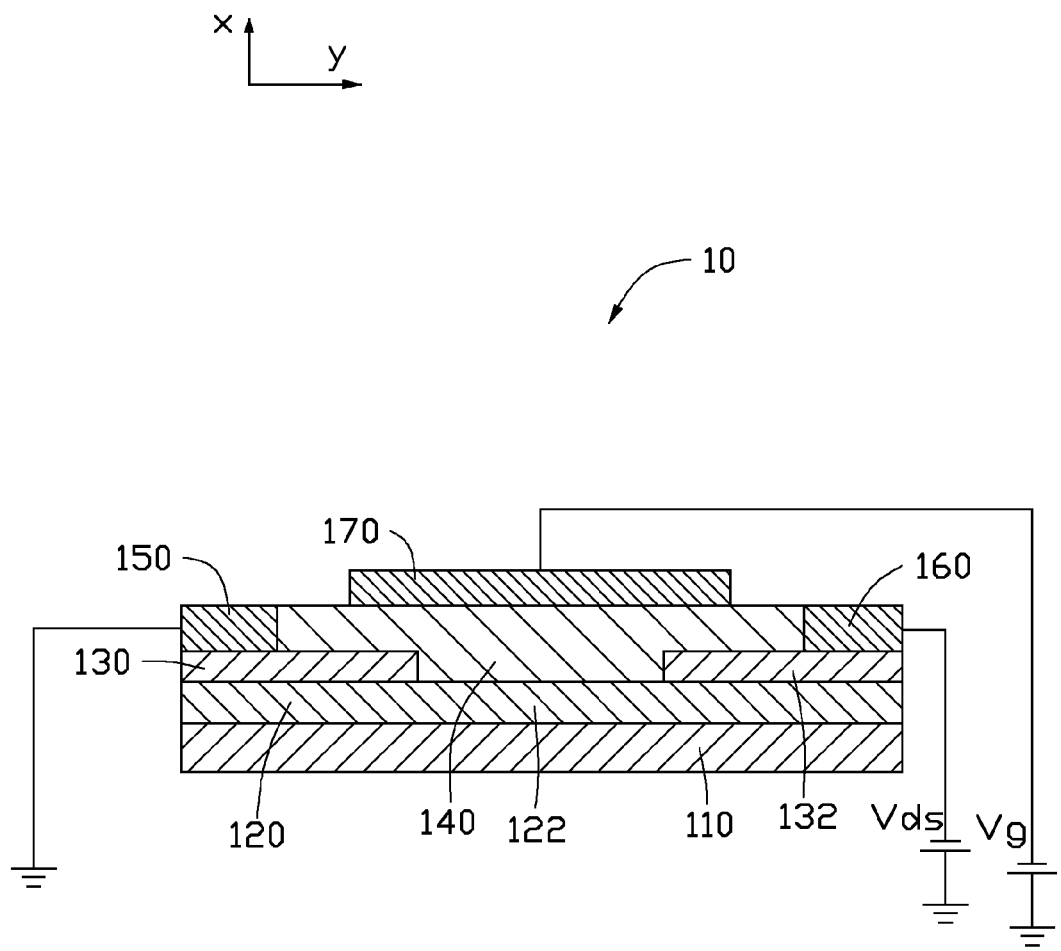
FIG. 2 is a schematic view of the thin film transistor of FIG. 1 connected to a circuit.

Referring to FIG. 2, in use, the source electrode 150 is grounded. A voltage Vds is applied to the drain electrode 160. Another voltage Vg is applied on the gate electrode 170. The voltage Vg forming an electric field in the channel 122 of the semiconducting layer 120. Accordingly, carriers exist in the channel near the gate electrode 170. As the Vg increasing, a current is generated and flows through the channel 122. Thus, the source electrode 150 and the drain electrode 160 are electrically connected.

The TFT has many advantages. The ohmic contacts, formed between the first conductive layer 130 and the source electrode 150 and between the second conductive layer 132 and the drain electrode 160, make a same selectivity of the electrons and holes of a current in the channel 122. A first conductive layer overlap consists of the entire length of the first conductive layer 130 that is overlapped by the gate electrode 170, said first conductive layer overlap being defined in a direction parallel with the uppermost surface of the first conductive layer 130; a second conductive layer overlap consists of the entire length of the second conductive layer 132 that is overlapped by the gate electrode 170, said second conductive layer overlap being defined in a direction parallel with the uppermost surface of the second conductive layer 132. A total length of the first conductive layer overlap and a total length of the second conductive layer overlap is defined as l. The length l of part of the second conductive layer 132 overlapped by the gate electrode 170 and the distance d between the gate electrode 170 and the first conductive layer 130 or the second conductive layer 132 along the Y direction satisfy the formula: l□d, thus the channel 122 will be completely modulated by the gate electrode 170. The symmetry of bipolar TFT will be high.

A method of making the TFT is further provided. The method includes following steps:

Step (S1), providing an insulating substrate 110, and forming an semiconductor layer 120 on the insulating substrate 110;

Step (S2), forming a first conductive layer 130 and a second conductive layer 132 on the semiconductor layer 120, wherein the first conductive layer 130 and the second conductive layer 132 are spaced with each other;

Step (S3), forming a source electrode 150 on the first conductive layer 130, and forming a drain electrode 160 on the second conductive layer 132;

Step (S4), forming an insulating layer 140 on the semiconductor layer 120, part of the first conductive layer 130 and the second conductive layer 132 is covered by the insulating layer 140; and Step (S4), forming a gate electrode 170 on the insulating layer 140.

In step (S1), the semiconductor layer 120 can be formed via chemical vapor deposition or chemical separation. In one embodiment, the semiconductor layer 120 is a disordered network of a plurality of semi-conductive carbon nanotubes, the plurality of semi-conductive carbon nanotubes is formed via chemical separation, and a thickness of the semiconductor layer 120 is about 5 nanometers.

In step (S2), the first conductive layer 130 and the second conductive layer 132 can be formed by laying a conductive film on the semiconductor layer 120 directly. The first conductive layer 130 and the second conductive layer 132 are formed by following steps: laying a continuous conductive film on the semiconductor layer 120 directly; and etching the conductive film via photo lithography, reactive ion etching (RIE), and electron beam lithography. In one embodiment, the first conductive layer 130 and the second conductive layer 132 are formed by etching a graphene film via RIE. Furthermore, before forming the first conductive layer 130 and the second conductive layer, a protective layer (not shown) can be formed on a first surface 121 of the semiconductor layer 120. The protective layer can protect the semiconductor layer 120 in the process of etching the graphene film. The material of the protective layer is the same as the insulating layer 140.

In step (S3), the source electrode 150 and the drain electrode 160 can be formed via evaporating or sputtering. In one embodiment, the source electrode 150 and the drain electrode 160 is formed on the first conductive layer 130 via evaporating, and the drain electrode 160 is formed on the second conductive layer 132 via evaporating. The thickness of the source electrode 150 is about 40 nanometers. The thickness of the drain electrode 160 is about 40 nanometers.

In step (S4), the insulating layer 140 can be formed via evaporating or sputtering. In one embodiment, the insulating layer 140 is formed on the first surface 121 of the semiconductor layer 120 via evaporating and covers part of the first conductive layer 130 and part of the second conductive layer 132. The thickness of insulating layer 140 is about 40 nanometers.

In step (S5), the method of forming the gate electrode 170 is the same as the method of forming the source electrode 150 or the drain electrode 160. In one embodiment, the thickness of the gate electrode 170 is about 40 nanometers.

Figure 3:
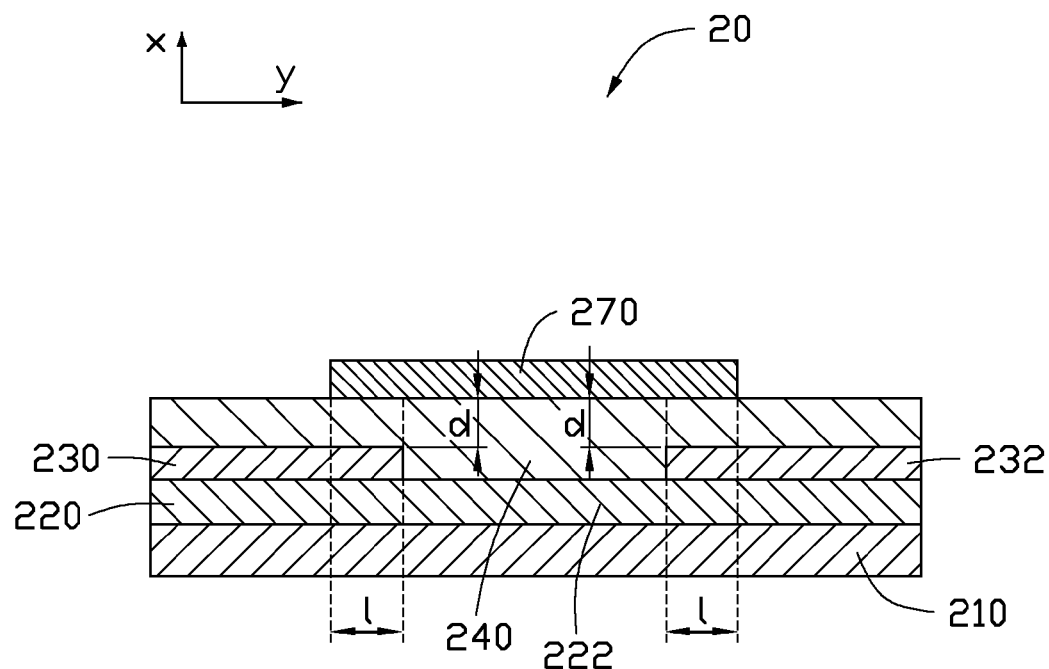
FIG. 3 is a cross sectional view of another embodiment of a thin film transistor.

FIG. 3 shows a thin film transistor 20 having a top gate structure. The thin film transistor 20 includes a semiconductor layer 220, a first conductive layer 230, a second conductive layer 232, an insulating layer 240, and a gate electrode 270. The thin film transistor 20 is located on a surface of insulating substrate 210.

The structure of the thin film transistor 20 is similar to the structure of the thin film transistor 10, except that the first conductive layer 230 can be connected with an external circuit as a source electrode and the second conductive layer 232 can be connected with the external circuit as a drain electrode. The insulating layer 240 can cover the first conductive layer 230 and the second conductive layer 232. In one embodiment, the insulating layer 240 covers a part of the first conductive layer 230 and the second conductive layer 232 and exposing other part of the first conductive layer 230 and the second conductive layer 232.

Figure 4:
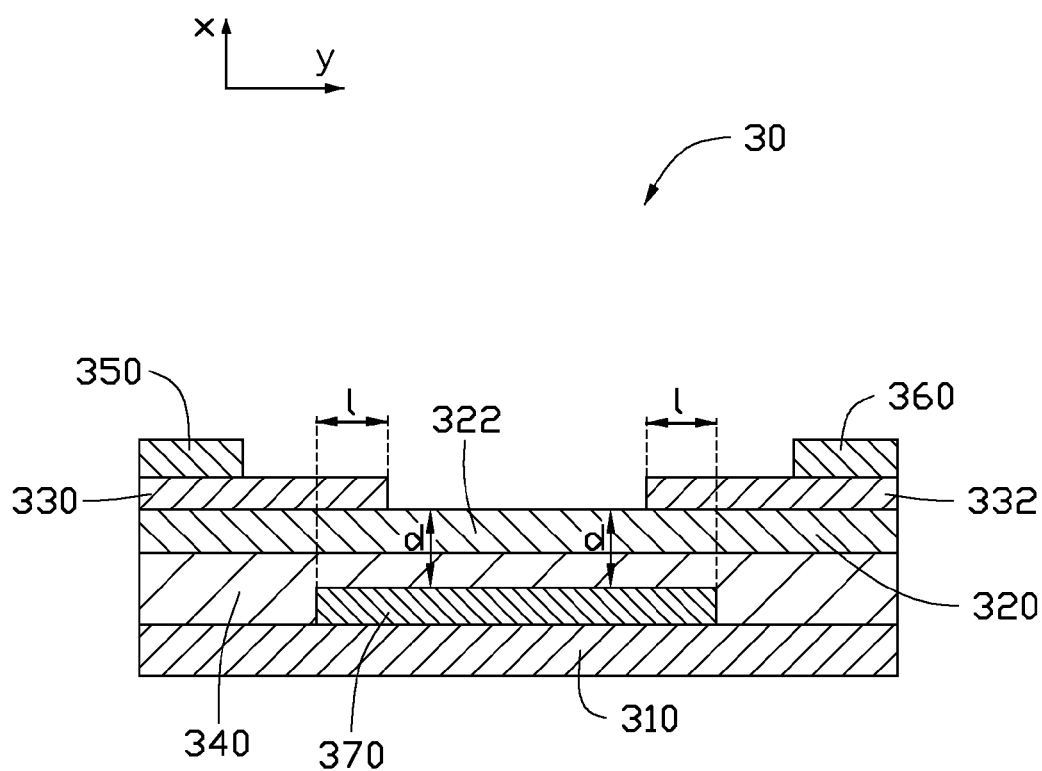
FIG. 4 is a cross sectional view of another embodiment of a thin film transistor.

FIG. 4 shows a thin film transistor 30 is having a bottom gate structure. The thin film transistor 30 includes a semiconductor layer 320, a first conductive layer 330, a second conductive layer 332, an insulating layer 340, a source electrode 350, a drain electrode 360, and a gate electrode 370. The thin film transistor 30 is located on a surface of insulating substrate 310.

The structure of the thin film transistor 30 is similar with the structure of the thin film transistor 10, except that the thin film transistor 30 has a bottom gate structure. The gate electrode 370 is located on a surface of the insulating substrate 310. The insulating layer 340 covers the gate electrode 370. The semiconductor layer 320 is located on the insulating layer 340, and insulated from the gate electrode 370 through the insulating layer 340. The first conductive layer 330 and the second conductive layer 332 are located on the insulating substrate 310 and spaced from each other. The source electrode 350 is located on the first conductive layer 330. The drain electrode 360 is located on the second conductive layer 332.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A thin film transistor, comprising:
a source electrode;
a drain electrode spaced from the source electrode;
a semiconductor layer comprising a carbon nanotube layer;
a first conductive layer sandwiched between the source electrode and the semiconductor layer;
a second conductive layer sandwiched between the drain electrode and the semiconductor layer; and
a gate electrode insulated with the semiconductor layer, the first conductive layer, the second conductive layer, the source electrode and the drain electrode by an insulating layer,
wherein a first work-function of a first material of the first conductive layer and the second conductive layer is the same as a second work-function of a second material of the semiconductor layer, a channel is defined as a part of the semiconductor layer overlapped by the gate electrode along a thickness direction of the semiconductor layer, the first conductive layer and the second conductive layer extend toward each other and each cover a part of the channel; a first conductive layer overlap consists of the entire length of the first conductive layer that is overlapped by the gate electrode, said first conductive layer overlap being defined in a direction parallel with the uppermost surface of the first conductive layer; a second conductive layer overlap consists of the entire length of the second conductive layer that is overlapped by the gate electrode, said second conductive layer overlap being defined in a direction parallel with the uppermost surface of the second conductive layer; a total length of the first conductive layer overlap is greater than or equal to a total distance between the gate electrode and the first conductive layer in a direction perpendicular to a top surface of the first conductive layer, and a total length of the second conductive layer overlap is greater than or equal to a total distance between the gate electrode and the second conductive layer in a direction perpendicular to a top surface of the second conductive layer.

2. The thin film transistor of claim 1, wherein the first conductive layer and the second conductive layer are spaced from each other.

3. The thin film transistor of claim 2, wherein each of the first conductive layer and the second conductive layer comprises a graphene film.

4. The thin film transistor of claim 3, wherein the graphene film comprises a plurality of graphene layers stacked with each other.

5. The thin film transistor of claim 3, wherein a thickness of the graphene film is in a range from about 0.34 nanometers to about 10 nanometers.

6. The thin film transistor of claim 1, wherein each of the first conductive layer and the second conductive layer comprises metallic carbon nanotubes.

7. The thin film transistor of claim 1, wherein the carbon nanotube layer comprises a carbon nanotube film, and the carbon nanotube film comprises a plurality of single-wall carbon nanotubes joined by van der Waals attractive force.

8. The thin film transistor of claim 7, wherein the plurality of single-wall carbon nanotubes is disordered.

9. The thin film transistor of claim 1, wherein the carbon nanotube layer comprises a plurality of single-wall carbon nanotubes paralleled with each other.

10. The thin film transistor of claim 9, wherein a length of each of the plurality of single-wall carbon nanotubes is greater than 5 micrometers.

11. The thin film transistor of claim 10, wherein each of the plurality of single-wall carbon nanotubes comprises a first end and a second end opposite to the first end, the first end is electrically connected to the source electrode, and the second end is electrically connected to the drain electrode.

12. The thin film transistor of claim 1, wherein a part of the first conductive layer is overlapped by the gate electrode along the thickness direction of the semiconductor layer, and a part of the second conductive layer is overlapped by the gate electrode along the thickness direction of the semiconductor layer.

13. The thin film transistor of claim 1, wherein the thin film transistor further comprises an insulating substrate, and the semiconductor layer is directly located on a surface of the insulating substrate.

14. The thin film transistor of claim 1, wherein a surface of the gate electrode is a planar surface.

15. A thin film transistor, comprising:
a first conductive layer, wherein a material of the first conductive layer comprises metallic carbon nanotubes;
a second conductive layer spaced from the first conductive layer, wherein a material of the second conductive layer comprises metallic carbon nanotubes;
a semiconductor layer electrically connecting the first conductive layer and the second conductive layer; and
a gate electrode insulated with the semiconductor layer, the first conductive layer, and the second conductive layer by an insulating layer,
wherein a first work-function of a first material of the first conductive layer and the second conductive layer is the same as a second work-function of a second material of the semiconductor layer, a channel is defined as a part of the semiconductor layer overlapped by the gate electrode along a thickness direction of the semiconductor layer, the first conductive layer and the second conductive layer extend toward each other and each cover a part of the channel; a first conductive layer overlap consists of the entire length of the first conductive layer that is overlapped by the gate electrode, said first conductive layer overlap being defined in a direction parallel with the uppermost surface of the first conductive layer; a second conductive layer overlap consists of the entire length of the second conductive layer that is overlapped by the gate electrode, said second conductive layer overlap being defined in a direction parallel with the uppermost surface of the second conductive layer; a total length of the first conductive layer overlap is greater than or equal to a total distance between the gate electrode and the first conductive layer in a direction perpendicular to a top surface of the first conductive layer, and a total length of the second conductive layer overlap is greater than or equal to a total distance between the gate electrode and the second conductive layer in a direction perpendicular to a top surface of the second conductive layer.

16. A thin film transistor, comprising:
a source electrode;
a drain electrode spaced from the source electrode;
a semiconductor layer comprising a carbon nanotube layer;
a first conductive layer sandwiched between the source electrode and the semiconductor layer, wherein the first conductive layer comprises a graphene film;
a second conductive layer sandwiched between the drain electrode and the semiconductor layer, wherein the second conductive layer comprises the graphene film; and
a gate electrode insulated with the semiconductor layer, the first conductive layer, the second conductive layer, the source electrode and the drain electrode by an insulating layer,
wherein a first work-function of a first material of the first conductive layer and the second conductive layer is the same as a second work-function of a second material of the semiconductor layer, a channel is defined as a part of the semiconductor layer overlapped by the gate electrode along a thickness direction of the semiconductor layer, the first conductive layer and the second conductive layer extend toward each other and each cover a part of the channel; a first conductive layer overlap consists of the entire length of the first conductive layer that is overlapped by the gate electrode, said first conductive layer overlap being defined in a direction parallel with the uppermost surface of the first conductive layer; a second conductive layer overlap consists of the entire length of the second conductive layer that is overlapped by the gate electrode, said second conductive layer overlap being defined in a direction parallel with the uppermost surface of the second conductive layer; a total length of the first conductive layer overlap is greater than or equal to a total distance between the gate electrode and the first conductive layer in a direction perpendicular to a top surface of the first conductive layer, and a total length of the second conductive layer overlap is greater than or equal to a total distance between the gate electrode and the second conductive layer in a direction perpendicular to a top surface of the second conductive layer.

17. The thin film transistor of claim 16, wherein the graphene film comprises a plurality of graphene layers stacked with each other.

18. The thin film transistor of claim 17, wherein a thickness of the graphene film is in a range from about 0.34 nanometers to about 10 nanometers.

19. The thin film transistor of claim 16, wherein the carbon nanotube layer comprises a carbon nanotube film, and the carbon nanotube film comprises a plurality of single-wall carbon nanotubes joined by van der Waals attractive force.

20. The thin film transistor of claim 16, wherein the carbon nanotube layer is composed of a combination of semi-conductive and metallic carbon nanotubes obtained via chemical vapor deposition, and the ratio of semi-conductive and metallic of carbon nanotubes is 2:1.

* * * * *